United States Patent
Morris et al.

(10) Patent No.: US 10,832,761 B2
(45) Date of Patent: *Nov. 10, 2020

(54) POLARIZATION GATE STACK SRAM

(71) Applicant: Intel Corporation, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/732,951

(22) Filed: Jan. 2, 2020

(65) Prior Publication Data

US 2020/0118616 A1 Apr. 16, 2020

Related U.S. Application Data

(63) Continuation of application No. 16/078,582, filed as application No. PCT/US2016/025606 on Apr. 1, 2016, now Pat. No. 10,559,349.

(51) Int. Cl.
| | | |
|---|---|---|
| *G11C 11/00* | (2006.01) | |
| *G11C 11/412* | (2006.01) | |
| *G11C 8/16* | (2006.01) | |
| *G11C 11/419* | (2006.01) | |
| *H01L 27/11* | (2006.01) | |
| *G11C 11/22* | (2006.01) | |

(52) U.S. Cl.
CPC ........... *G11C 11/412* (2013.01); *G11C 8/16* (2013.01); *G11C 11/419* (2013.01); *H01L 27/11* (2013.01); *G11C 11/223* (2013.01)

(58) Field of Classification Search
CPC .................................................. G11C 11/412
USPC ......................................................... 365/154
See application file for complete search history.

(56) References Cited

U.S. PATENT DOCUMENTS

| | | | |
|---|---|---|---|
| 2003/0107068 A1* | 6/2003 | Forbes | ......... H01L 29/516 257/295 |
| 2003/0179634 A1 | 9/2003 | Miwa et al. | |
| 2005/0073876 A1 | 4/2005 | Chen et al. | |
| 2006/0268615 A1 | 11/2006 | Kang et al. | |
| 2006/0268622 A1 | 11/2006 | Kang et al. | |
| 2008/0106953 A1 | 5/2008 | Madurawe | |

(Continued)

OTHER PUBLICATIONS

International Search Report and Written Opinion for International Patent Application No. PCT/US2016/025606 dated Dec. 27, 2016, 12 pgs.

(Continued)

*Primary Examiner* — Hoai V Ho
(74) *Attorney, Agent, or Firm* — Schwabe, Williamson & Wyatt P.C.

(57) ABSTRACT

One embodiment provides an apparatus. The apparatus includes a first inverter comprising a first pull up transistor and a first pull down transistor; a second inverter cross coupled to the first inverter, the second inverter comprising a second pull up transistor and a second pull down transistor; a first access transistor coupled to the first inverter; and a second access transistor coupled to the second inverter. A gate electrode of one transistor of each inverter comprises a polarization layer.

20 Claims, 3 Drawing Sheets

(56) References Cited

U.S. PATENT DOCUMENTS

2009/0184346 A1* 7/2009 Jain .................. B82Y 10/00
257/288
2013/0069134 A1* 3/2013 Tanamoto ............ G11C 11/412
257/315

OTHER PUBLICATIONS

International Preliminary Report on Patentability for International Patent Application No. PCT/US2016/025606, dated Oct. 11, 2018, 8 pages.

* cited by examiner

POLARIZATION GATE STACK SRAM

CROSS-REFERENCE TO RELATED APPLICATION

This patent application is a continuation of U.S. patent application Ser. No. 16/078,582, filed Aug. 21, 2018, which is a U.S. National Phase Application under 35 U.S.C. § 371 of International Application No. PCT/US2016/025606, filed Apr. 1, 2016, entitled "POLARIZATION GATE STACK SRAM," which designates the United States of America, the entire disclosure of which is hereby incorporated by reference in its entirety and for all purposes.

FIELD

The present disclosure relates to SRAM (static random access memory), in particular to, polarization gate stack SRAM.

BACKGROUND

Static random access memory (SRAM) memory cells include a plurality of transistors. As technology advances, the sizes of the transistors may be reduced in order to reduce a size of the corresponding memory cell and associated memory array. Reducing the size of the transistors may result in increased variation in transistor operating characteristics and a corresponding decrease in operating margins, e.g., may result in read disturb.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure relates to a polarization gate stack SRAM (static random access memory) memory cell. The polarization gate stack SRAM memory cell includes a pair of cross coupled inverters. The first inverter includes a first pull up transistor and a first pull down transistor and the second inverter includes a second pull up transistor and a second pull down transistor. The polarization gate stack SRAM memory cell further includes a first access transistor coupled to the first inverter and a second access transistor coupled to the second inverter. A gate stack of one transistor of each inverter includes a polarization layer. The polarization layer may include a ferroelectric material and/or nanocrystals.

An apparatus, method and/or system are configured to utilize the polarization layer in a gate stack of a transistor to reduce leakage current when the associated transistor is turned off and to increase a read current during read operations. In an embodiment, the access transistors may be NMOS (n-channel metal oxide semiconductor field effect transistors (MOSFETs)) transistors and the polarization layers may be contained in the gate stacks of the pull down transistors. In another embodiment, the access transistors maybe PMOS (p-channel MOSFETs) transistors and the polarization layers may be contained in the gate stacks of the pull up transistors.

Polarization of the polarization layer is configured to enhance the gate bias during read operations and to thus increase a drive current of the associated transistors. Increasing the drive current may reduce a likelihood of read disturb and enhance speed of read operations. Polarization of the polarization layer is further configured to increase an effective threshold voltage when a corresponding transistor is turned off and to thus decrease a leakage current when the associated transistor is turned off. The polarization layers (i.e., ferroelectric materials and/or nanocrystals) may be polarized by application of an electric field, e.g., as a result of an applied voltage. The polarization may be reversed by applying a voltage of opposite polarity to the polarization layer. Advantageously, the applied voltages correspond to bias and/or supply voltages configured to turn an associated transistor ON or OFF during operation of the SRAM memory cell.

Figure 1:
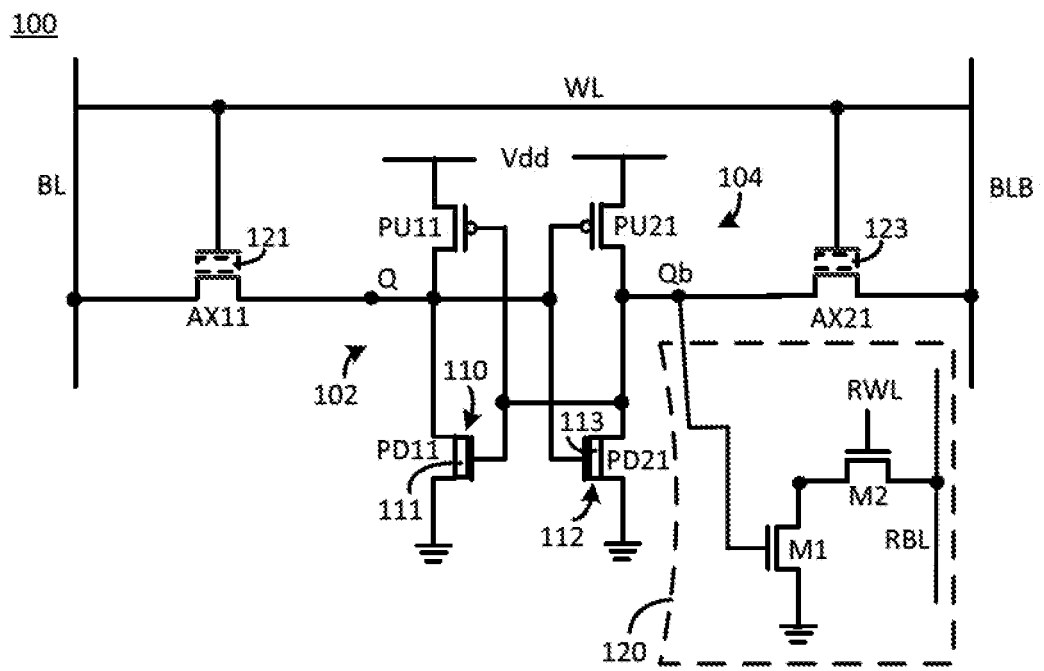
FIG. 1 illustrates a SRAM (static random access memory) memory cell consistent with an embodiment of the present disclosure.
Figure 1:
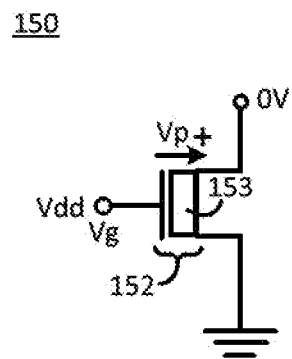
Figure 1:
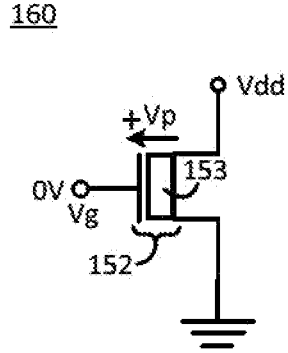

FIG. 1 illustrates a SRAM (static random access memory) memory cell 100 consistent with an embodiment of the present disclosure. In some embodiments, the SRAM memory cell 100 includes six transistors (6T). In some embodiments, the SRAM memory cell 100 includes eight transistors (8T). The SRAM memory cell 100 includes two NMOS access transistors AX11, AX21, two PMOS pull up transistors PU11, PU21 and two NMOS pull down transistors PD11, PD21. The SRAM memory cell 100 may further include read access transistors M1 and M2. Thus, a 6T SRAM memory cell and an 8T SRAM memory cell both include transistors AX11, AX12, PU11, PU21, PD11 and PD21, and the 8T SRAM memory cell further includes transistors M1 and M2.

For example, the transistors AX11, AX12, PU11, PU21, PD11 and PD21 (and transistors M1 and M2, if present) may be finFET and/or nanowire, i.e., nonplanar, MOSFETs. The transistors may have a relatively thin body thickness, e.g., in the range of 5 to 10 nanometers (nm). One or more of the transistors may be relatively low doped, e.g., concentration of dopant atoms of less than 1.0e18 dopant atoms per cubic centimeter (cm3).

The pull up transistors PU11, PU21 are coupled to a supply voltage, Vdd, and the pull down transistors PD11, PD21 are coupled to ground. A first inverter 102 includes first pull up transistor PU11 coupled to the first pull down transistor PD11. A second inverter 104 includes the second pull up transistor PU21 coupled to the second pull down transistor PD21. A first data node Q (i.e., an output of the first inverter 102) is coupled to the drains of the first pull up transistor PU11 and the first pull down transistor PD11. A second data node Qb (i.e., an output of the second inverter 104) is coupled to the drains of the second pull up transistor PU21 and the second pull down transistor PD21.

The access transistors AX11, AX21 are configured to control access to the SRAM memory cell 100. A respective gate electrode of each access transistor AX11, AX21 is coupled to a word line (WL), a drain electrode of the first access transistor AX11 is coupled to a first bit line (BL) and a drain electrode of the second access transistor AX21 is coupled to a second bit line (BLB). A source electrode of the first access transistor AX11 is coupled to the first data node Q (i.e., output node) and a source electrode of the second access transistor AX21 is coupled to the second data node Qb (i.e., inverted output node). In the embodiments that include read access transistors M1, M2 (i.e., 8T SRAM), access transistors AX11, AX12, may be utilized for write access and the read access transistors M1, M2 may provide read access. Read access transistors M1, M2 may be MOS-FETs and are coupled to second data node Qb, a read word line RWL and a read bit line RBL (i.e., read circuitry 120).

In operation, the SRAM memory cell 100 may be selected for memory access operations, by, e.g., a processor, by coupling appropriate control inputs to the word lines WL and/or RWL configured to turn on access transistors AX11 and AX2 or read access transistor M2. Data may then be stored to and/or read from SRAM memory cell 100 by applying a differential voltage across the bit line pair BL, BLB and/or reading a differential voltage across the bit line pair BL, BLB (or reading read bit line RBL). The SRAM memory cell 100 is configured to maintain the stored data as long as the cross coupled inverters, i.e., transistors PU11, PD11, PU21 and PU21, remain powered.

The SRAM memory cell 100 may store a logic one or a logic zero. For example, when the SRAM memory cell 100 stores a logic zero, pull up transistor PU11 and pull down transistor PD21 are turned off, and pull down transistor PD11 and pull up transistor PU21 are turned on. Conversely, when the SRAM memory cell 100 stores a logic one, pull up transistor PU11 and pull down transistor PD21 are turned on, and pull down transistor PD11 and pull up transistor PU21 are turned off.

Pull down transistors PD11, PD21 each include a gate stack 110, 112. Each gate stack 110, 112 may include a gate electrode (i.e., a gate metal layer), a gate oxide layer and a polarization layer 111, 113. Each polarization layer 111, 113 may contain a ferroelectric material and/or nanocrystals. For example, ferroelectric materials may include, but are not limited to, BaTiO3 (Barium titanium oxide), PbTiO3 (Lead titanium oxide), Pb(Zr0.2Ti0.8)O3 (Lead zirconium titanium oxide), BiFe0.95Ru0.05O3 (Bismuth iron ruthenium oxide), HfOx (Hafnium oxide) and/or HfZrOx (Hafnium Zirconium Oxide). In another example, the nanocrystals may include, but are not limited to, Si (Silicon), Ge (Germanium), Si/Ge, Al (Aluminum), W (Tungsten) and/or TiN (Titanium nitride).

In some embodiments, the access transistors AX11, AX21 may each include a polarization layer 121, 123 in a respective access transistor AX11, AX21 gate stack. Including the polarization layer 121, 123 in the access transistors AX11, AX21 is configured to facilitate manufacturing cost reduction. For example, the access transistors AX11, AX21 may be fabricated, in part, in a common process with the pull-down transistors PD11, PD21, thus facilitating the manufacturing cost reduction.

The polarization layers 111, 113 are positioned between a gate electrode and a channel of each pull down transistor PD11, PD21. In an embodiment, the polarization layers 111, 113 may be sandwiched between the gate oxide layer and the gate metal layer of each gate stack 110, 112. In another embodiment, the polarization layers 111, 113 may be sandwiched between the gate oxide layer and a respective channel of each pull down transistor PD11, PD21. Each polarization layer 111, 113 may be polarized by applying a voltage across the respective polarization layers 111, 113, as described herein.

FIG. 1 further illustrates an example pull down transistor 150 in an ON state and an example pull down transistor 160 in an OFF state. The pull down transistors 150, 160 correspond to pull down transistors PD11, PD21 of SRAM memory cell 100 and are provided to illustrate operation. The pull down transistors 150, 160 include a polarization gate stack 152 that corresponds to polarization gate stacks 110, 112 of SRAM memory cell 100. The polarization gate stack 152 includes a polarization layer 153, as described herein. The polarization layer 153 corresponds to polarization layers 111, 113 of SRAM memory cell 100.

For example, when the SRAM memory cell 100 stores a logic zero, the bias voltage, e.g., Vdd, that turns on pull down transistor PD11 may polarize polarization layer 111 so that a corresponding polarization of polarization layer 111 is from the gate electrode to the channel of the pull down transistor PD11. Similarly, when the SRAM memory cell 100 stores a logic one, the bias voltage, Vdd, that turns on pull down transistor PD21 may polarize polarization layer 113 so that a corresponding polarization of the polarization layer 113 is from the gate electrode to the channel of the pull down transistor PD21.

The polarization for a pull down transistor, e.g., pull down transistor PD11 or PD21, in the ON state is illustrated by the arrow on pull down transistor 150 (i.e., from the gate electrode to the channel). The polarization may result in a voltage, Vp, across the polarization layer 153 and thus across polarization gate stack 152 with a relatively more positive node indicated by the plus sign near the head of the arrow. Thus, in the ON state, the polarization orientation of the polarization layer 153 may provide an additional voltage in series with the gate voltage (Vg=supply voltage Vdd). The additional voltage is configured to provide an additional bias to the associated pull down transistor, as described herein.

When each pull down transistor PD11, PD21 is turned OFF, their respective gate electrodes may be coupled to ground and a drain source voltage corresponding to the supply voltage Vdd may be across their respective drain—source electrodes. This may cause the polarization layers 111, 113 to repolarize with a positive polarization direction from channel to gate electrode. The polarization for a pull down transistor, e.g., pull down transistor PD11 or PD21, in the OFF state is illustrated by the arrow on pull down transistor 160. The polarization may result in a voltage, Vp, across the polarization layer 153 and thus across polarization gate stack 152 with a relatively more positive node indicated by the plus sign. Thus, in the OFF state, the polarization orientation of the polarization layer 153 may provide a negative voltage in series with the gate voltage (Vg=0 volts (V)). The additional voltage is configured to provide a negative voltage (i.e., -Vp) to the channel of the associated pull down transistor, as described herein.

Pull down transistors PD11, PD21 may be finFETs or nanowire transistors, as described herein. Thus, polarization switching, as described herein, is related to source and drain voltages. A transistor body potential may not affect the electric field applied to the polarization layer and thus, may not affect polarization switching. In other words, a magnitude of a gate dimension, e.g., gate length, is relatively small so that polarization switching characteristics depend on source and drain voltages rather than body voltage. Advantageously, polarization switching of polarization layers may be controlled by voltages that are applied to the transistors during memory access operations of the associated SRAM memory cell 100. In other words, rather than applying a polarization voltage configured to polarize or repolarize a polarization layer, the polarization layer may be polarized or repolarized in response to a voltage applied to read from or write to the associated SRAM memory cell 100.

The leakage current is related to the voltage seen by the channel, Vc, which is a serial combination of the gate voltage Vg and the voltage, Vp, across the polarization layer. Decreasing the combined voltage may decrease the leakage current. For example, if the positive polarization direction of the polarization layer 111, 113 is from the channel to gate electrode, then when the respective pull down transistor PD11, P21 is turned off, each channel may experience a negative combined voltage due to the polarization of the polarization layers 111, 113. The negative combined voltage may then reduce the leakage current of the pull down transistor PD11, PD21. In other words, a portion of the electrical energy applied to the cross coupled inverters configured to maintain a state of the SRAM memory cell 100 may polarize the polarization layers 111, 113. The polarization layers 111, 113 may then effectively negatively bias the gates of pull down transistor PD11, PD21 when they are off and thus reduce associated leakage current.

When access transistors AX11, AX21 and a respective pull down transistor PD11, PD21 are turned ON, a read path may exist between the respective pull down transistor PD11, PD12, corresponding data node Q, Qb and the corresponding access transistor AX11, AX21. The magnitude of the current through the read path may affect a duration of a read operation. For example, a relatively low current through the access transistor AX11, AX21 may result in a relatively slow read performance, i.e., a relatively longer read operation duration. Conversely, if the read current through the access transistor AX11, AX21 is higher than the corresponding current through the pull down transistors PD11, PD21, a read disturb event may occur (i.e., unintentional change of state of the SRAM memory cell 100 during a read operation).

The polarization of the polarization layers 111, 113 may reduce the likelihood of read disturb. The polarization of the polarization layers 111, 113 may increase the drive current of the pull down transistors PD11, PD21. For example, when the SRAM memory cell 100 stores a logic zero, during a read operation, current may flow from the first pull down transistor PD11 to the first bit line BL via access transistor AX11. The polarization of polarization layer 111 may contribute to the bias of the first pull down transistor PD11(i.e., Vg+Vp) and allow the first pull down transistor PD11 to source relatively more current for a same drain source bias. Similarly, when the SRAM memory cell 100 stores a logic one, during a read operation, current may flow from second pull down transistor PD21 to the second bit line BLB via second access transistor AX21. The polarization of polarization layer 113 may contribute to the bias of the second pull down transistor PD21 and allow the second pull down transistor PD21 to source relatively more current. Thus, a likelihood of read disturb may be reduced and a speed of a read operation may be enhanced. In other words, enhanced current flow may facilitate a faster read operation.

Write operations may not be directly affected by the addition of the polarization layers 111, 113. Indirectly, the addition of the polarization layers 111, 113 may facilitate improved write operations. For example, write speeds may be increased by decreasing supply voltage, Vdd. Decreasing the supply voltage Vdd may detrimentally affect read margins and thus increase a likelihood of read disturb. The polarization layers 111, 113 may mitigate such detrimental effects by, e.g., adding the polarization voltage in series with the gate voltage, as described herein. Thus, the supply voltage Vdd may be decreased during write operations and the polarization layers 111, 113 may mitigate the effects of a reduced supply voltage during read operations, as described herein.

Figure 2:
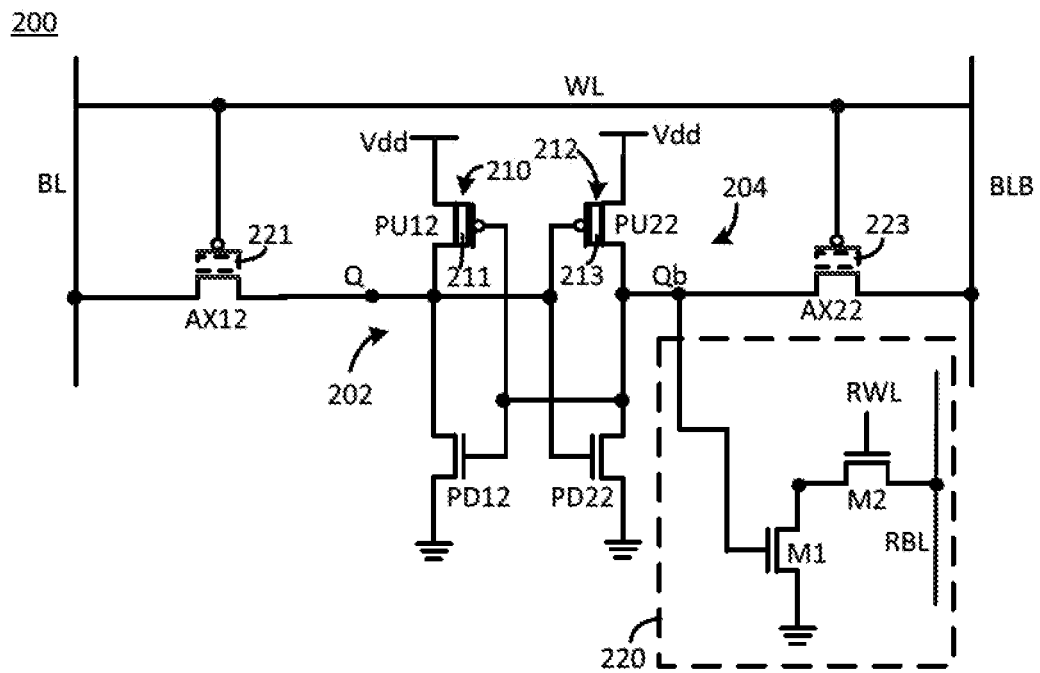
FIG. 2 illustrates another SRAM memory cell consistent with another embodiment of the present disclosure.
Figure 2:
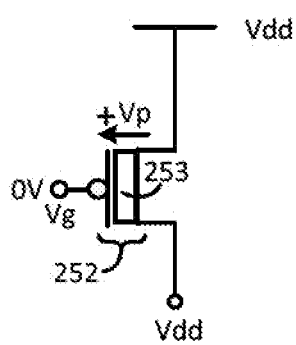
Figure 2:
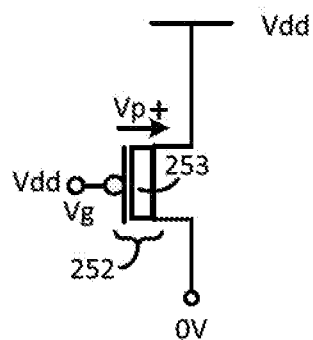

FIG. 2 illustrates another SRAM memory cell 200 consistent with one embodiment of the present disclosure. The SRAM memory cell 200 has a same configuration as SRAM memory cell 100 of FIG. 1, except access transistors AX12, AX22 are PMOS rather than NMOS and the ferroelectric material is included in polarization layers 211, 213 of pull up transistors PU12, PU22. Similar to pull down transistors PD11, PD21 of FIG. 1, pull up transistors PU12, PU22 may be finFETs or nanowire transistors.

Pull up transistors PU12, PU22 each include a gate stack 210, 212. Each gate stack 210, 212 may include a gate electrode (i.e., a gate metal layer), a gate oxide layer and a polarization layer 211, 213. Each polarization layer 211, 213 may contain ferroelectric material and/or nanocrystals, as described herein. The polarization layers 211, 213 are positioned between a gate electrode and a channel of each pull up transistor PU12, PU22. In an embodiment, the polarization layers 211, 213 may be sandwiched between the gate oxide layer and the metal layer of each gate stack 210, 212. In another embodiment, the polarization layers 211, 213 may be sandwiched between the gate oxide layer and a respective channel of each pull up transistor PU12, PU22. Each polarization layer 211, 213 may be polarized by applying a voltage across the respective polarization layers 211, 213, as described herein.

In some embodiments, the access transistors AX12, AX22 may each include a polarization layer 221, 223 in a respective access transistor AX12, AX22 gate stack. Including the polarization layer 221, 223 in the access transistors AX12, AX22 is configured to facilitate manufacturing cost reduction. For example, the access transistors AX12, AX22 may be fabricated, in part, in a common process with the pull-up transistors PD12, PD22, thus facilitating the manufacturing cost reduction.

FIG. 2 further illustrates an example pull up transistor 250 in an ON state and an example pull up transistor 260 in an OFF state. The pull up transistors 250, 260 correspond to pull up transistors PU12, PU22 of SRAM memory cell 200 and are provided to illustrate operation. The pull up transistors 250, 260 include a polarization gate stack 252 that corresponds to polarization gate stacks 210, 212 of SRAM memory cell 200. The polarization gate stack 252 includes a polarization layer 253, as described herein. The polarization layer 253 corresponds to polarization layers 211, 213 of SRAM memory cell 200.

For example, when the SRAM memory cell 200 stores a logic zero, the applied voltages (i.e., Vg=0V, Vd=Vs=Vdd) that turn ON pull up transistor PU22 may polarize polarization layer 213 with a positive polarization direction from the channel to the gate electrode of PU22. In other words, Vgs=Vgd=−Vdd. The applied voltages (i.e., Vg=Vd=Vdd, Vs=0V) that turn OFF pull up transistor PU12 may polarize layer 212 with a positive polarization direction from the gate electrode to the channel of PU12.

The polarization for a pull up transistor, e.g., pull up transistor PU12 or PU22, in the ON state is illustrated by the arrow on pull up transistor 250 (i.e., from the channel to the gate electrode). The polarization may result in a voltage, Vp, across the polarization layer 253 and thus polarization gate stack 252 with a relatively more positive node indicated by the plus sign near the head of the arrow. Thus, in the ON state, the polarization orientation of the polarization layer 253 may provide a negative voltage in series with the gate voltage (Vg=0 volts (V)). The additional voltage is configured to provide an additional negative voltage (i.e., −Vp) to the channel of the associated pull up transistor, as described herein.

Similarly, when the SRAM memory cell 200 stores a logic one, the applied voltages (i.e., Vg=0V, Vd=Vs=Vdd) that turn ON pull up transistor PU12 may polarize polarization layer 211 with a positive polarization direction from the channel to the gate electrode of PU12. In other words, Vgs=Vgd=−Vdd. The applied voltages (i.e., Vg=Vd=Vdd, Vs=0V) that turn OFF pull up transistor PU22 may polarize layer 213 with a positive polarization direction from the gate electrode to the channel of PU22.

The polarization for a pull up transistor, e.g., pull up transistor PU12 or PU22, in the OFF state is illustrated by the arrow on pull up transistor 260 (i.e., from the gate electrode to the channel). The polarization may result in a voltage, Vp, across the polarization layer 253 and thus polarization gate stack 252 with a relatively positive node indicated by the plus sign. Thus, in the OFF state, the polarization orientation of the polarization layer 253 may provide a positive voltage in series with the gate voltage (Vg=supply voltage Vdd). The additional voltage is configured to provide an additional positive voltage (i.e., Vp) to the associated pull up transistor, as described herein.

The polarized polarization layers 211, 213 may then operate to reduce a likelihood of read disturb, increase read current and/or decrease a leakage current, similar to the effects of the polarization layers 111, 113 of pull down transistors PD11, PD21 of FIG. 1.

In some embodiments, access transistors AX11 and AX12 of FIGS. 1 or AX12 and AX22 of FIG. 2 may include polarization layers 121 and 123 or 221 and 223, as described herein. The polarization of these access transistor polarization layers may switch (i.e., change from positive gate to channel to positive channel to gate or change from positive channel to gate to positive gate to channel) with the application of a word line voltage. In some embodiments, polarization switching may occur after a period of time (i.e., a delay). The delay may be configured to provide an enhanced read disturb margin before repolarization.

In some embodiments, the WL voltage may be relatively low, configured to inhibit repolarization of the access transistor gate stack. In some embodiments, the access transistor AX11 and AX12 or AX12 and AX22 gate-source voltage and gate-drain voltage may inhibit repolarization of the gate stack. For example, a relatively low gate to drain voltage may inhibit repolarization of the gate stack. In some embodiments, the access transistor may be operated to provide a relatively low gate to drain bias configured to inhibit repolarization. Similarly, in some embodiments, the pull down (or pull-up) transistor may be operated to have a relatively high gate-to-drain bias when the SRAM memory cell (e.g., SRAM memory cell 100 of FIG. 1 or SRAM memory cell 200 of FIG. 2) is storing data.

Figure 3:
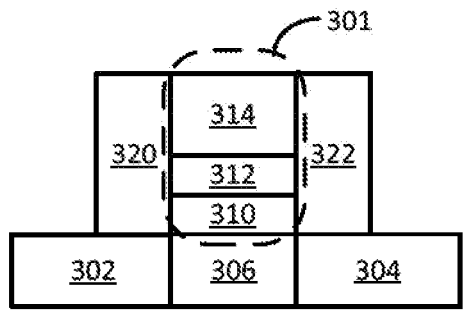
FIG. 3 illustrates a transistor structure consistent with several embodiments of the present disclosure.

FIG. 3 illustrates a transistor structure 300 including a gate stack 301 consistent with several embodiments of the present disclosure. Transistor structure 300 may correspond to pull down transistors PD11, PD21 of FIG. 1 or pull up transistors PU12, PU22, of FIG. 2. In some embodiments, transistor structure 300 may correspond to access transistors AX11, AX21 of FIG. 1 and/or access transistors AX12, AX22 of FIG. 2. The transistor structure 300 includes a source 302, a drain 304, and a channel 306. The transistor structure 300 further includes a gate stack 301 that includes a first layer 310 adjacent the channel 306, a second layer 312 adjacent the first layer 310 and a gate electrode 314 adjacent the second layer 312. The transistor structure 300 may further include spacers 320, 322. The first spacer 320 is adjacent the source 302 and the gate stack 301 and the second spacer 322 is adjacent the drain 304 and the gate stack 301.

In an embodiment, the first layer 310 may correspond to a polarization layer, i.e., a ferroelectric layer and/or a nanocrystal layer, and the second layer 312 may include a gate oxide. In this embodiment, the first layer 310 may include a ferroelectric material and/or nanocrystals, as described herein. Thus, the first layer 310 may correspond to layers 111, 113 of FIG. 1 or layers 211, 213 of FIG. 2. In this embodiment, the polarization layer is sandwiched between the gate oxide layer and the channel 306. In another embodiment, the first layer 310 may include the gate oxide and the second layer 312 may include the polarization layer. In this embodiment, the second layer 312 may include a ferroelectric material and/or nanocrystals, as described herein. Thus, the second layer 312 may correspond to layers 111, 113 of FIG. 1 or layers 211, 213 of FIG. 2. In this embodiment, the polarization layer is sandwiched between the gate oxide layer and a gate metal layer, i.e., the gate electrode 314.

Figure 4:
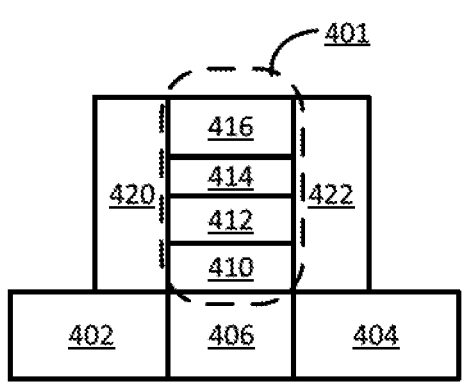
FIG. 4 illustrates another transistor structure consistent with several embodiments of the present disclosure.

FIG. 4 illustrates a transistor structure 400 including a gate stack 401 consistent with several embodiments of the present disclosure. Transistor structure 400 may correspond to one or more transistors in FIG. 1 or FIG. 2. The transistor structure 400 includes a source 402, a drain 404, and a channel 406. The transistor structure 400 further includes a gate stack 401 that includes a first layer 410 adjacent to the channel 406, a second layer 412 adjacent to the first layer 410, a third layer 414 adjacent the second layer 412, and a gate electrode 416 adjacent the third layer 414. The transistor structure 400 may further include spacers 420, 422. The first spacer 420 is adjacent the source 402 and the gate stack 401 and the second spacer 422 is adjacent the drain 404 and the gate stack 401.

In an embodiment, the first layer 410 may correspond to an oxide layer, the second layer 412 may include a conductive electrode (i.e., a floating gate electrode) and the third layer 414 may correspond to a ferroelectric layer. Thus, the ferroelectric layer 414 may correspond to layers 111, 113 of FIG. 1 or layers 211, 213 of FIG. 2. In this embodiment, the ferroelectric layer is sandwiched between the gate electrode 416 and a floating gate electrode 412.

Thus, an SRAM memory cell, e.g., SRAM memory cell 100 or SRAM memory cell 200, may include a polarization layer in a gate stack of one transistor of each inverter. The polarization layers may be polarized by data storage operations of the respective SRAM memory cell. The polarized polarization layers may then operate to reduce leakage current, increase read current and reduce a likelihood of read disturb (i.e., increase read margins).

Figure 5:
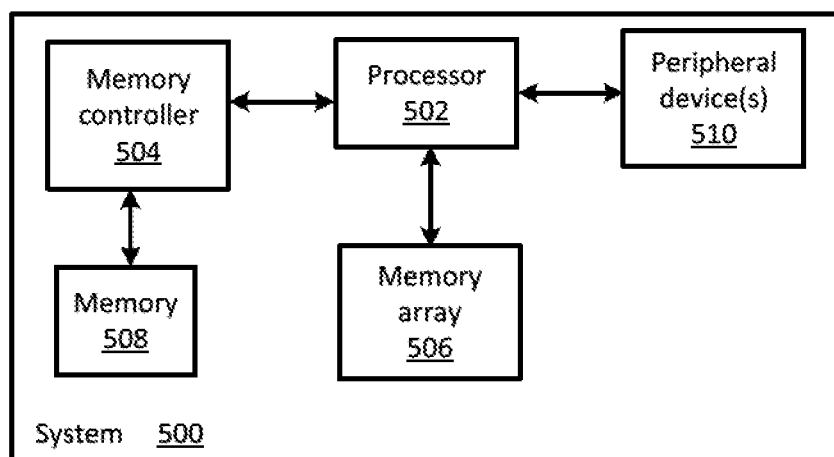
FIG. 5 illustrates a functional block diagram of a system consistent with several embodiments of the present disclosure.

FIG. 5 illustrates a functional block diagram of a system 500 including a memory array consistent with several embodiments of the present disclosure. System 500 includes a processor 502 and a memory array 506. The system 500 may further include a memory controller 504, memory 508 and/or one or more peripheral devices 510. System 500 may include, but is not limited to, a mobile telephone including, but not limited to, a smart phone (e.g., iPhone®, Android®-based phone, Blackberry®, Symbian®-based phone, Palm®-based phone, etc.); a wearable device (e.g., wearable computer, "smart" watches, smart glasses, smart clothing, etc.) and/or system; an Internet of Things (IoT) networked device including, but not limited to, a sensor system (e.g., environmental, position, motion, etc.) and/or a sensor network (wired and/or wireless); a computing system (e.g., a server, a workstation computer, a desktop computer, a laptop computer, a tablet computer (e.g., iPad®, GalaxyTab® and the like), an ultraportable computer, an ultramobile computer, a netbook computer and/or a subnotebook computer; etc.

Processor 502 is configured to perform operations associated with system 500. Processor 502 may include one or more processing unit(s), i.e., cores. Memory controller 504 is configured to couple processor 502 to memory 508 and may be configured to manage accesses to memory 508. Peripheral devices 510 may include a user interface (e.g., a key pad, keyboard, touch pad, mouse, display, touch sensitive display), one or more sensor(s) (e.g., an accelerometer, global positioning system (GPS), gyroscope, etc.), storage device(s) (e.g., hard disk drive, solid state drive, etc.), etc.

Memory array 506 may contain a plurality of polarization gate stack SRAM memory cells, e.g., SRAM memory cells 100 and/or 200, as described herein. In some embodiments, memory array 506 and processor 502 may be on a same die. In some embodiments, memory array 506 may be coupled, e.g., connected, to the processor 502. Processor 502 may be configured to provide control inputs to polarization gate stack SRAM memory cells included in memory array 506 and to capture output signals. For example, processor 502 may be configured to select and/or unselect one or more polarization gate stack SRAM memory cells and to write (e.g., set and/or reset) and/or read selected polarization gate stack SRAM memory cells.

Generally, this disclosure relates to a polarization gate stack SRAM (static random access memory) memory cell. The polarization gate stack SRAM memory cell includes a pair of cross coupled inverters. The first inverter includes a first pull up transistor and a first pull down transistor and the second inverter includes a second pull up transistor and a second pull down transistor. The polarization gate stack SRAM memory cell further includes a first access transistor coupled to the first inverter and a second access transistor coupled to the second inverter. A gate stack of one transistor of each inverter includes a polarization layer. The polarization layer may include a ferroelectric material and/or nanocrystals.

An apparatus, method and/or system are configured to utilize the polarization layer in a gate stack of a transistor to reduce leakage current when the associated transistor is turned off and to increase a read current during read operations. In an embodiment, the access transistors may be NMOS transistors and the polarization layers may be contained in the gate stacks of the pull down transistors. In another embodiment, the access transistors maybe PMOS transistors and the polarization layers may be contained in the gate stacks of the pull up transistors.

Polarization of the polarization layer is configured to enhance the gate bias during read operations and to thus increase a drive current of the associated transistors. Increasing the drive current may reduce a likelihood of read disturb. Polarization of the polarization layer is further configured to increase an effective threshold voltage when a corresponding transistor is turned off and to thus decrease a leakage current when the associated transistor is turned off.

As used in any embodiment herein, the term "logic" may refer to an app, software, firmware and/or circuitry configured to perform any of the aforementioned operations.

Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry", as used in any embodiment herein, may comprise, for example, singly or in any combination, hard-wired circuitry, programmable circuitry such as computer processors comprising one or more individual instruction processing cores, state machine circuitry, and/or firmware that stores instructions executed by programmable circuitry. The logic may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc.

The foregoing provides example system architectures and methodologies, however, modifications to the present disclosure are possible. The processor may include one or more processor cores and may be configured to execute system software. System software may include, for example, an operating system. Device memory may include I/O memory buffers configured to store one or more data packets that are to be transmitted by, or received by, a network interface. The operating system (OS) may be configured to manage system resources and control tasks that are run on, e.g., system 500. For example, the OS may be implemented using Microsoft® Windows®, HP-UX®, Linux®, or UNIX®, although other operating systems may be used. In another example, the OS may be implemented using Android™, iOS, Windows Phone® or BlackBerry®.

Memory 508 may include one or more of the following types of memory: semiconductor firmware memory, programmable memory, non-volatile memory, read only memory, electrically programmable memory, random access memory, static random access memory (SRAM), dynamic random access memory (DRAM), flash memory, magnetic disk memory, and/or optical disk memory. Either additionally or alternatively system memory may include other and/or later-developed types of computer-readable memory.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog—Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to a polarization gate stack SRAM, as discussed below.

Example 1 According to this example, there is provided an apparatus. The apparatus includes a first inverter, a second inverter, a first access transistor, and a second access transistor. The first inverter includes a first pull up transistor and a first pull down transistor. The second inverter includes a second pull up transistor and a second pull down transistor. The second inverter is cross coupled to the first inverter. The first access transistor is coupled to the first inverter. The second access transistor is coupled to the second inverter. A gate stack of one transistor of each inverter includes a polarization layer.

Example 2 This example includes the elements of example 1, wherein each pull down transistor includes the polarization layer.

Example 3 This example includes the elements of example 1, wherein each pull up transistor includes the polarization layer.

Example 4 This example includes the elements of example 1, wherein the first access transistor and the second access transistor each includes a polarization layer.

Example 5 This example includes the elements according to any one of examples 1 to 4, wherein the polarization layer comprises a ferroelectric material selected from the group including BaTiO3 (Barium titanium oxide), PbTiO3 (Lead titanium oxide), Pb(Zr0.2Ti0.8)O3 (Lead zirconium titanium oxide), BiFe0.95Ru0.05O3 (Bismuth iron ruthenium oxide), HfOx (Hafnium oxide) and/or HfZrOx (Hafnium Zirconium Oxide).

Example 6 This example includes the elements according to any one of examples 1 to 4, wherein the polarization layer is sandwiched between a gate oxide layer and a gate metal layer of each gate stack.

Example 7 This example includes the elements according to any one of examples 1 to 4, wherein the polarization layer is sandwiched between a gate oxide layer of each gate stack and a respective channel of each transistor that includes the polarization layer.

Example 8 This example includes the elements according to any one of examples 1 to 4, wherein the polarization layer includes a nanocrystal material selected from the group comprising Si (Silicon), Ge (Germanium), Si/Ge, Al (Aluminum), W (Tungsten) and/or TiN (Titanium nitride).

Example 9 This example includes the elements according to any one of examples 1 to 4, wherein the polarization layer is sandwiched between a gate electrode and a floating gate electrode of each gate stack.

Example 10 This example includes the elements according to any one of examples 1 to 4, further including a first read transistor coupled to the second inverter and a second read transistor coupled to the first read transistor, a read word line, and a read bit line.

Example 11 This example includes the elements according to any one of examples 1 to 4, wherein each transistor is nonplanar.

Example 12 This example includes the elements according to any one of examples 1 to 4, wherein each polarization layer is to reduce leakage current when the associated transistor is turned off and to increase a read current during read operations.

Example 13 According to this example, there is provided a memory array. The memory array incudes a plurality of SRAM (static random access memory) memory cells. Each memory cell includes a first inverter, a second inverter, a first access transistor, and a second access transistor. The first inverter includes a first pull up transistor and a first pull down transistor. The second inverter includes a second pull up transistor and a second pull down transistor. The second inverter is cross coupled to the first inverter. The first access transistor is coupled to the first inverter. The second access transistor is coupled to the second inverter. A gate stack of one transistor of each inverter includes a polarization layer.

Example 14 This example includes the elements of example 13, wherein each pull down transistor includes the polarization layer.

Example 15 This example includes the elements of example 13, wherein each pull up transistor includes the polarization layer.

Example 16 This example includes the elements of example 13, wherein the first access transistor and the second access transistor each includes a polarization layer.

Example 17 This example includes the elements according to any one of examples 13 to 16, wherein the polarization layer comprises a ferroelectric material selected from the group including BaTiO3 (Barium titanium oxide), PbTiO3 (Lead titanium oxide), Pb(Zr0.2Ti0.8)O3 (Lead zirconium titanium oxide), BiFe0.95Ru0.05O3 (Bismuth iron ruthenium oxide), HfOx (Hafnium oxide) and/or HfZrOx (Hafnium Zirconium Oxide).

Example 18 This example includes the elements according to any one of examples 13 to 16, wherein the polarization layer is sandwiched between a gate oxide layer and a gate metal layer of each gate stack.

Example 19 This example includes the elements according to any one of examples 13 to 16, wherein the polarization layer is sandwiched between a gate oxide layer of each gate stack and a respective channel of each transistor that includes the polarization layer.

Example 20 This example includes the elements according to any one of examples 13 to 16, wherein the polarization layer includes a nanocrystal material selected from the group comprising Si (Silicon), Ge (Germanium), Si/Ge, Al (Aluminum), W (Tungsten) and/or TiN (Titanium nitride).

Example 21 This example includes the elements according to any one of examples 13 to 16, wherein the polarization layer is sandwiched between a gate electrode and a floating gate electrode of each gate stack.

Example 22 This example includes the elements according to any one of examples 13 to 16, further including a first read transistor coupled to the second inverter and a second read transistor coupled to the first read transistor, a read word line and a read bit line.

Example 23 This example includes the elements according to any one of examples 13 to 16, wherein each transistor is nonplanar.

Example 24 This example includes the elements according to any one of examples 13 to 16, wherein each polarization layer is to reduce leakage current when the associated transistor is turned off and to increase a read current during read operations.

Example 25 According to this example, there is provided a system. The system includes a processor and a memory array. The processor includes at least one core. The memory array includes a plurality of static random access memory (SRAM) memory cells. Each SRAM memory cell includes a first inverter, a second inverter, a first access transistor, and a second access transistor. The first inverter includes a first pull up transistor and a first pull down transistor. The second inverter includes a second pull up transistor and a second pull down transistor. The second inverter is cross coupled to the first inverter. The first access transistor is coupled to the first inverter. The second access transistor is coupled to the second inverter. A gate stack of one transistor of each inverter includes a polarization layer.

Example 26 This example includes the elements of example 25, wherein each pull down transistor includes the polarization layer.

Example 27 This example includes the elements of example 25, wherein each pull up transistor includes the polarization layer.

Example 28 This example includes the elements of example 25, wherein the first access transistor and the second access transistor each includes a polarization layer.

Example 29 This example includes the elements according to any one of examples 25 to 28, wherein the polarization layer comprises a ferroelectric material selected from the group including BaTiO3 (Barium titanium oxide), PbTiO3 (Lead titanium oxide), Pb(Zr0.2Ti0.8)O3 (Lead zirconium titanium oxide), BiFe0.95Ru0.05O3 (Bismuth iron ruthenium oxide), HfOx (Hafnium oxide) and/or HfZrOx (Hafnium Zirconium Oxide).

Example 30 This example includes the elements according to any one of examples 25 to 28, wherein the polarization layer is sandwiched between a gate oxide layer and a gate metal layer of each gate stack.

Example 31 This example includes the elements according to any one of examples 25 to 28, wherein the polarization layer is sandwiched between a gate oxide layer of each gate stack and a respective channel of each transistor that includes the polarization layer.

Example 32 This example includes the elements according to any one of examples 25 to 28, wherein the polarization layer includes a nanocrystal material selected from the group comprising Si (Silicon), Ge (Germanium), Si/Ge, Al (Aluminum), W (Tungsten) and/or TiN (Titanium nitride).

Example 33 This example includes the elements according to any one of examples 25 to 28, wherein the polarization layer is sandwiched between a gate electrode and a floating gate electrode of each gate stack.

Example 34 This example includes the elements according to any one of examples 25 to 28, further including a first read transistor coupled to the second inverter and a second read transistor coupled to the first read transistor, a read word line and a read bit line.

Example 35 This example includes the elements according to any one of examples 25 to 28, wherein each transistor is nonplanar.

Example 36 This example includes the elements according to any one of examples 25 to 28, wherein each polarization layer is to reduce leakage current when the associated transistor is turned off and to increase a read current during read operations.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An SRAM memory cell, comprising:
a first invertor having a first pull up transistor and a first pull down transistor, wherein the first pull down transistor comprises a first gate stack having a ferroelectric material between a gate oxide and a channel of the first pull down transistor, the ferroelectric material in contact with the gate oxide;
a first access transistor coupled to the first invertor, wherein the first access transistor comprises a second gate stack having a ferroelectric material;
a second invertor having a second pull up transistor and a second pull down transistor; and
a second access transistor coupled to the second invertor.

2. The SRAM memory cell of claim 1, wherein the second pull down transistor comprises a third gate stack having a ferroelectric material.

3. The SRAM memory cell of claim 1, wherein the second access transistor comprises a third gate stack having a ferroelectric material.

4. The SRAM memory cell of claim 1, wherein the second pull down transistor comprises a third gate stack having a ferroelectric material, and wherein the second access transistor comprises a fourth gate stack having a ferroelectric material.

5. The SRAM memory cell of claim 1, wherein the ferroelectric material of the first gate stack is between and in contact with a first gate oxide and a channel of the first pull down transistor, and wherein the ferroelectric material of the second gate stack is between and in contact with a second gate oxide and a channel of the first access transistor.

6. The SRAM memory cell of claim 1, wherein the ferroelectric material of the first gate stack and the ferroelectric material of the second gate stack comprise hafnium and oxygen.

7. An SRAM memory cell, comprising:
a first invertor having a first pull up transistor and a first pull down transistor, wherein the first pull down transistor comprises a first gate stack having a polarization layer between a gate oxide and a channel of the first pull down transistor, the polarization layer in contact with the gate oxide;

a first access transistor coupled to the first invertor, wherein the first access transistor comprises a second gate stack having a polarization layer;
a second invertor having a second pull up transistor and a second pull down transistor; and
a second access transistor coupled to the second invertor.

8. The SRAM memory cell of claim 7, wherein the second pull down transistor comprises a third gate stack having a polarization layer.

9. The SRAM memory cell of claim 7, wherein the second access transistor comprises a third gate stack having a polarization layer.

10. The SRAM memory cell of claim 7, wherein the second pull down transistor comprises a third gate stack having a polarization layer, and wherein the second access transistor comprises a fourth gate stack having a polarization layer.

11. The SRAM memory cell of claim 7, wherein the polarization layer of the first gate stack is between and in contact with a first gate oxide and a channel of the first pull down transistor, and wherein the polarization layer of the second gate stack is between and in contact with a second gate oxide and a channel of the first access transistor.

12. The SRAM memory cell of claim 7, wherein the polarization layer of the first gate stack and the polarization layer of the second gate stack comprise hafnium and oxygen.

13. A system, comprising:
a processor; and
a memory array coupled to the processor, the memory array comprising an SRAM memory cell, and the SRAM memory cell comprising:
a first invertor having a first pull up transistor and a first pull down transistor, wherein the first pull down transistor comprises a first gate stack having a ferroelectric material between a gate oxide and a channel of the first pull down transistor, the ferroelectric material in contact with the gate oxide;
a first access transistor coupled to the first invertor, wherein the first access transistor comprises a second gate stack having a ferroelectric material;
a second invertor having a second pull up transistor and a second pull down transistor; and
a second access transistor coupled to the second invertor.

14. The system of claim 13, further comprising:
a memory controller; and
a memory, wherein the memory controller is configured to couple the processor to the memory.

15. The system of claim 13, further comprising:
a peripheral device coupled to the processor.

16. The system of claim 15, wherein the peripheral device is a user interface selected from the group consisting of a keypad, a keyboard, a touch pad, a mouse, a display, and a touch sensitive display.

17. The system of claim 15, wherein the peripheral device is a sensor selected from the group consisting of an accelerometer, a global positioning system, and a gyroscope.

18. The system of claim 15, wherein the peripheral device is a storage device selected from the group consisting of a hard disk drive and a solid state drive.

19. The system of claim 13, wherein the memory array and the processor are on a same die.

20. The system of claim 13, wherein the system is selected from the group consisting of a mobile telephone, a smart phone, a wearable device, an Internet of Things networked device, a sensor system, and a computing system.

* * * * *